(12) United States Patent
Taniguchi

(10) Patent No.: US 12,375,186 B2
(45) Date of Patent: Jul. 29, 2025

(54) MULTIPLEXER

(71) Applicant: Murata Manufacturing Co., Ltd., Nagaokakyo (JP)

(72) Inventor: Yasumasa Taniguchi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 436 days.

(21) Appl. No.: 17/953,376

(22) Filed: Sep. 27, 2022

(65) Prior Publication Data

US 2023/0020490 A1 Jan. 19, 2023

Related U.S. Application Data

(63) Continuation of application No. PCT/JP2021/013004, filed on Mar. 26, 2021.

(30) Foreign Application Priority Data

Mar. 31, 2020 (JP) ................................. 2020-062604

(51) Int. Cl.
*H04B 15/00* (2006.01)

(52) U.S. Cl.
CPC .................................... *H04B 15/00* (2013.01)

(58) Field of Classification Search
CPC .............. H04B 15/00; H04B 1/0057
See application file for complete search history.

(56) References Cited

U.S. PATENT DOCUMENTS

| | | | |
|---|---|---|---|
| 10,601,570 B2* | 3/2020 | Takamine | H04L 25/00 |
| 10,680,578 B2* | 6/2020 | Saji | H10N 30/8542 |
| 2018/0323769 A1 | 11/2018 | Yamamoto | |
| 2019/0067551 A1 | 2/2019 | Saji | |
| 2019/0149312 A1 | 5/2019 | Takamine | |

(Continued)

FOREIGN PATENT DOCUMENTS

| | | |
|---|---|---|
| JP | 2019041307 A | 3/2019 |
| WO | 2017073425 A1 | 5/2017 |

(Continued)

OTHER PUBLICATIONS

International Search Report in PCT/JP2021/013004, mailed Jun. 1, 2021, 3 pages.

(Continued)

*Primary Examiner* — Tuan H Nguyen
(74) *Attorney, Agent, or Firm* — Keating & Bennett, LLP

(57) ABSTRACT

A multiplexer includes a common terminal, first and second transmit filters, and a first receive filter connected to the common terminal and each including resonators, a relationship $Tx1c<Rx1c<Tx2c$ is satisfied, where $Tx1c$, $Tx2c$, and $Rx1c$ denote center frequencies of pass bands Tx1, Tx2, and Tx3 of the first and second transmit filters and the first receive filter, respectively, a resonator closest to the common terminal in the first receive filter is a series arm resonator, and a pitch ratio denoted by $pS1 (Rx1)/p(Tx2)$ is more than about 1 and less than or equal to about 1.035, where $p(Tx2)$ denotes an electrode finger pitch of an IDT electrode in a resonator closest to the common terminal in the second transmit filter and $pS1 (Rx1)$ denotes an electrode finger pitch of an IDT electrode of the series arm resonator closest to the common terminal in the first receive filter.

15 Claims, 9 Drawing Sheets

(56) References Cited

U.S. PATENT DOCUMENTS

2019/0238116 A1  8/2019  Takamine
2021/0013871 A1  1/2021  Nosaka

FOREIGN PATENT DOCUMENTS

| WO | 2018003297 A1 | 1/2018 |
| WO | 2018070273 A1 | 4/2018 |
| WO | 2018123545 A1 | 7/2018 |
| WO | 2019188007 A1 | 10/2019 |

OTHER PUBLICATIONS

Written Opinion in PCT/JP2021/013004, mailed Jun. 1, 2021, 3 pages.

* cited by examiner

MULTIPLEXER

CROSS REFERENCE TO RELATED APPLICATIONS

This application claims the benefit of priority to Japanese Patent Application No. 2020-062604 filed on Mar. 31, 2020 and is a Continuation Application of PCT Application No. PCT/JP2021/013004 filed on Mar. 26, 2021. The entire contents of each application are hereby incorporated herein by reference.

BACKGROUND OF THE INVENTION

1. Field of the Invention

The present invention relates s to a multiplexer including a common terminal, multiple transmit filters, and one or more receive filters, the multiple transmit filters and the one or more receive filters being connected to the common terminal.

2. Description of the Related Art

A multiplexer to be connected to an antenna has widely been used in a device such as a smartphone. In a multiplexer described in International Publication No. 2018/123545, multiple transmit filters and multiple receive filters having different pass bands are connected to a common terminal. The pass band of the first receive filter is located between the pass bands of the first and second transmit filters. The pass band of the second receive filter is located at higher frequencies than the pass bands of the first and second transmit filters and the pass band of the first receive filter. According to International Publication No. 2018/123545, the first and second transmit filters and the first and second receive filters are each a ladder filter including one or more parallel arm resonators and one or more series arm resonators. The one or more parallel arm resonators and the one or more series arm resonators are each formed by an acoustic wave resonator.

The multiplexer described above sometimes performs 2-uplink carrier aggregation in which signals in two frequency ranges are simultaneously transmitted. Such carrier aggregation causes intermodulation distortion (IMD) in some cases, leading to degradation of sensitivity of a first or second receive filter.

SUMMARY OF THE INVENTION

Preferred embodiments of the present invention provide multiplexers that are each able to reduce or prevent IMD and reduce or prevent degradation of sensitivity of a receive filter.

A multiplexer according to a preferred embodiment of the present invention includes a common terminal, and a first transmit filter, a second transmit filter, and a first receive filter connected to the common terminal and each including a plurality of resonators, a relationship Tx1c<Rx1c<Tx2c is satisfied, where Tx1c, Tx2c, and Rx1c denote center frequencies of a pass band Tx1 of the first transmit filter, a pass band Tx2 of the second transmit filter, and a pass band Rx1 of the first receive filter, respectively, a resonator closest to the common terminal in the first receive filter is a series arm resonator, and a pitch ratio denoted by pS1 (Rx1)/p (Tx2) is more than about 1 and less than or equal to about 1.035, where p (Tx2) denotes an electrode finger pitch of an interdigital transducer (IDT) electrode in a resonator closest to the common terminal in the second transmit filter and pS1 (Rx1) denotes an electrode finger pitch of an IDT electrode of the series arm resonator closest to the common terminal in the first receive filter.

Multiplexers according to preferred embodiments of the present invention are each able to reduce or prevent IMD and reduce or prevent degradation of receiving sensitivity of a receive filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

The preferred embodiments described in the specification for illustrative purposes and partial substitutions or combinations of configurations in different preferred embodiments are included.

Figure 1:
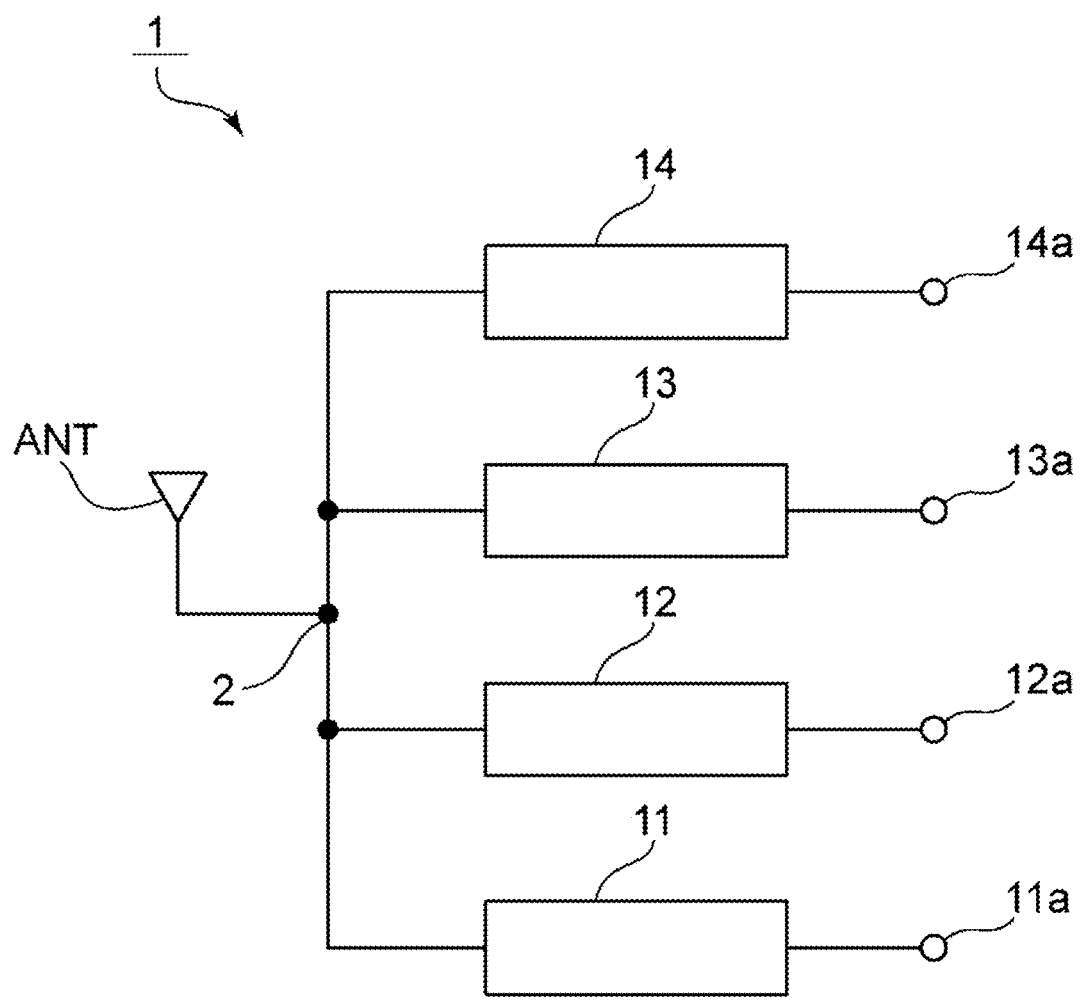
FIG. 1 is a schematic circuit diagram of a multiplexer according to a first preferred embodiment of the present invention.
Figure 2:
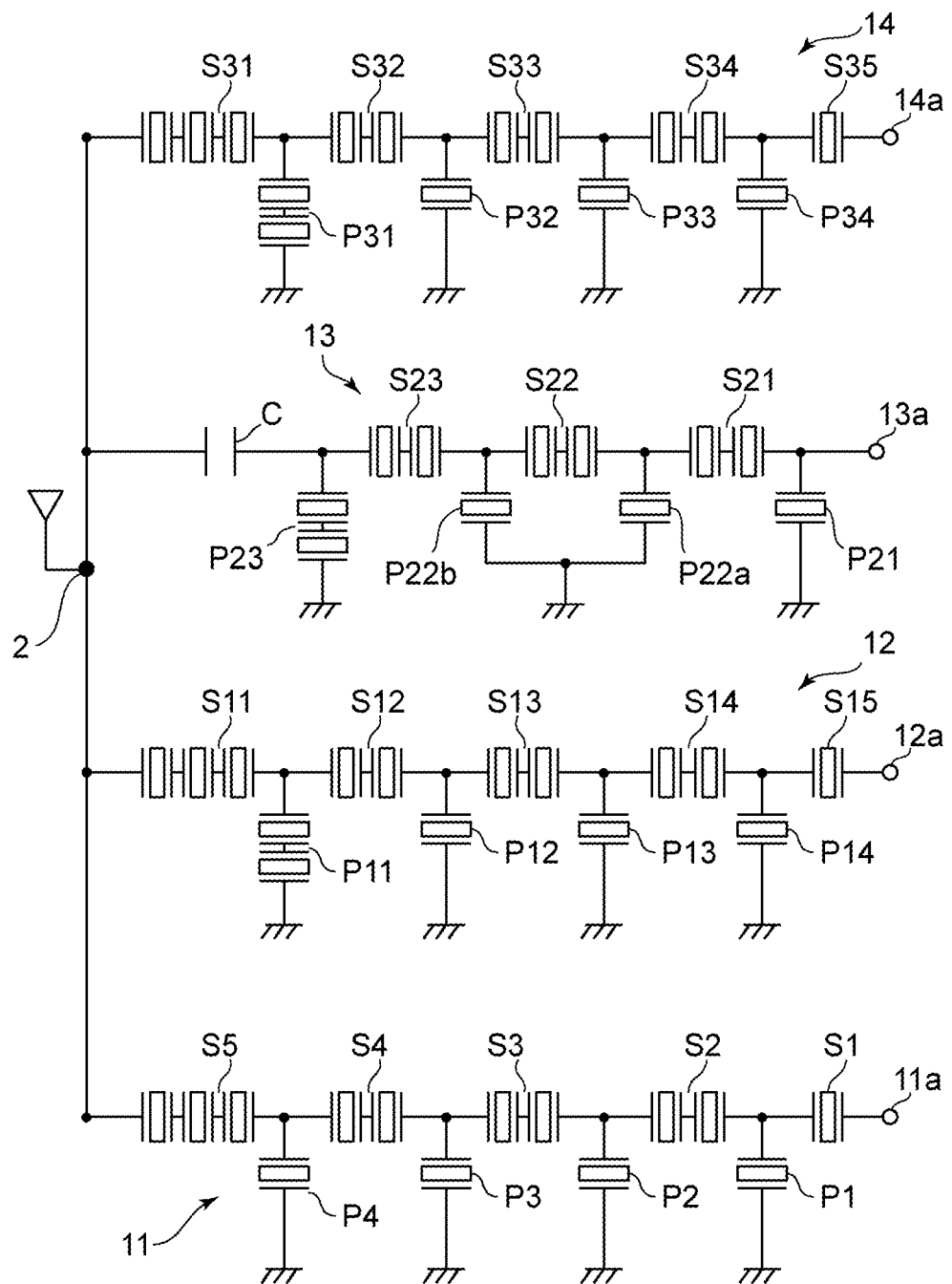
FIG. 2 is a more detailed circuit diagram of the multiplexer according to the first preferred embodiment of the present invention.

FIG. 1 is a schematic circuit diagram of a multiplexer according to a first preferred embodiment of the present invention, and FIG. 2 is a more detailed circuit diagram of the multiplexer.

As shown in FIG. 1, a multiplexer 1 includes a common terminal 2. The common terminal 2 is to be connected to an antenna ANT. A first transmit filter 11, a first receive filter 12, a second transmit filter 13, and a second receive filter 14 are each connected at one end to the common terminal 2. The pass band of the first transmit filter 11 is denoted by Tx1, the pass band of the first receive filter 12 is denoted by Rx1, the pass band of the second transmit filter 13 is denoted by Tx2, and the pass band of the second receive filter 14 is denoted by Rx2. The corresponding center frequencies of the above pass bands are respectively denoted by Tx1c, Rx1c, Tx2c, and Rx2c.

The first transmit filter 11 and the first receive filter 12 are a transmit filter and a receive filter in, for example, Band 3, respectively, and the second transmit filter 13 and the second receive filter 14 are a transmit filter and a receive filter in, for example, Band 1, respectively, in the present preferred embodiment.

Figure 3:
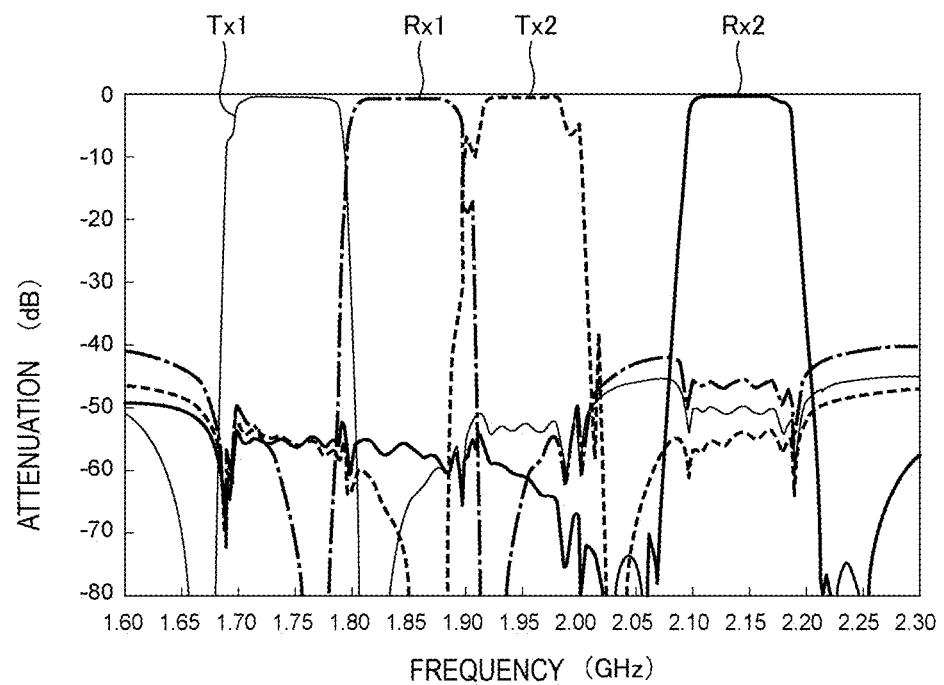
FIG. 3 shows attenuation-frequency characteristics representing a relationship among pass bands of first and second receive filters and first and second transmit filters in the multiplexer according to the first preferred embodiment of the present invention.

FIG. 3 shows a positional relationship in frequency among pass bands of the first transmit filter 11, the first receive filter 12, the second transmit filter 13, and the second receive filter 14. In FIG. 3 the thin line represents attenuation-frequency characteristics of the first transmit filter, the alternate long and short dash line represents attenuation-frequency characteristics of first receive the filter, the dashed line represents attenuation-frequency characteristics of the second transmit filter, and the solid line represents attenuation-frequency characteristics of the second receive filter.

Thus, frequencies of the pass bands described above are as follows.

Tx1=about 1710 MHz to about 1785 MHZ,
Rx1=about 1805 MHz to about 1880 MHZ,
Tx2=about 1920 MHz to about 1980 MHz, and
Rx2=about 2110 MHz to about 2170 MHz.

The center frequencies of the pass bands are as follows.

Tx1c=about 1747.5 MHZ,
Rx1c=about 1842.5 MHZ,
Tx2c=about 1950 MHz, and
Rx2c=about 2140 MHz.

As shown in FIG. 2, the first transmit filter 11, the first receive filter 12, the second transmit filter 13, and the second receive filter 14 are each a ladder filter including series arm resonators and parallel arm resonators. The series arm resonators and the parallel arm resonators are each defined by an acoustic wave resonator.

Figure 4A:
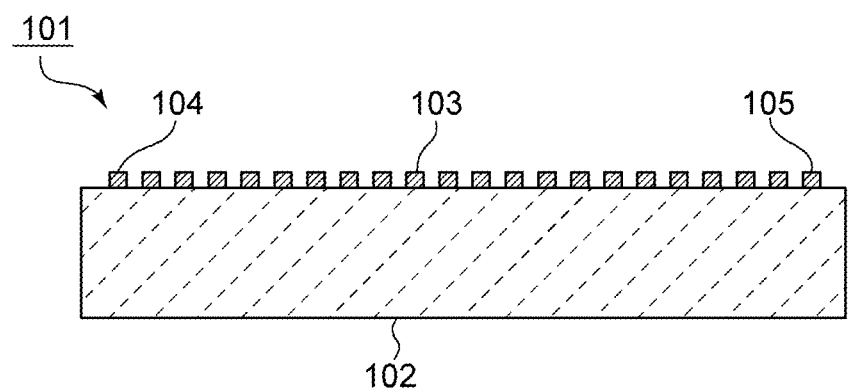
FIGS. 4A and 4B are a front elevational cross-sectional view of an acoustic wave resonator and a schematic plan view showing an electrode structure of the acoustic wave resonator.
Figure 4B:
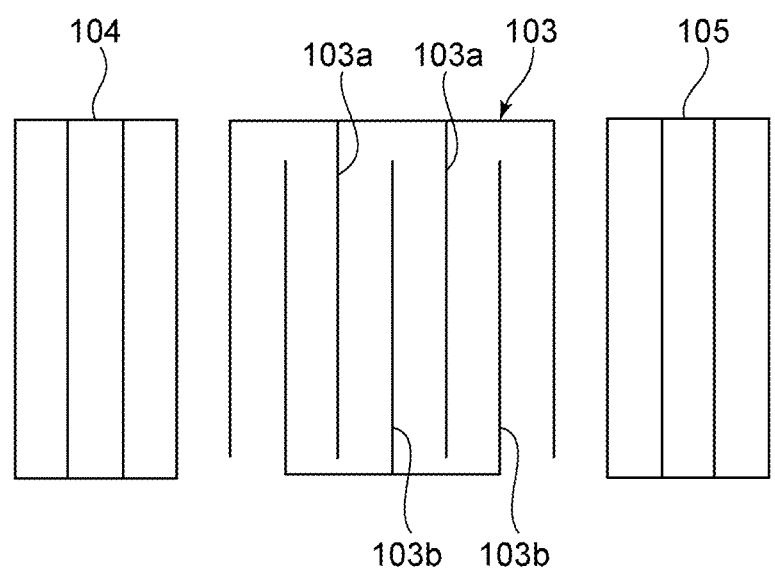

FIGS. 4A and 4B are a front elevational cross-sectional view of an acoustic wave resonator and a schematic plan view showing an electrode structure of the acoustic wave resonator. An acoustic wave resonator 101 includes a piezoelectric substrate 102. The piezoelectric substrate 102 is made of, for example, a piezoelectric single crystal, piezoelectric ceramics, or a multilayer body including a piezoelectric film and a support substrate. An IDT electrode 103 and reflectors 104 and 105 are disposed on the piezoelectric substrate 102. The IDT electrode 103 includes multiple first electrode fingers 103a and multiple second electrode fingers 103b. The multiple first electrode fingers 103a and the multiple second electrode fingers 103b are interdigitated with each other. An alternating-current electric field is applied between the first electrode fingers 103a and the second electrode fingers 103b, and an acoustic wave is excited. An electrode finger pitch p of the IDT electrode 103 is defined as the distance between the center of a first electrode finger 103a and the center of an adjacent second electrode finger 103b.

The electrode finger pitch p has a relationship $p=(½)\lambda$, where $\lambda$ is the wavelength of an acoustic wave and is determined by the electrode finger pitch p.

Referring back to FIG. 2, the first transmit filter 11 is connected between the common terminal 2 and a transmit terminal 11a. Series arm resonators S1 to S5 are disposed in a series arm connecting the transmit terminal 11a and the common terminal 2. Four parallel arms are disposed to connect the series arm and the ground potential. Parallel arm resonators P1, P2, P3, and P4 are disposed on the respective parallel arms.

By way of a non-limiting example, the series arm resonator S5 closest to the antenna terminal has a structure obtained by division of an acoustic wave resonator into three acoustic wave resonators connected in series.

Each of the series arm resonators S2 to S4 includes a series arm resonator obtained by division of an acoustic wave resonator into two acoustic wave resonators.

The first receive filter 12 is connected between the common terminal 2 and a receive terminal 12a. As shown, series arm resonators S11 to S15 are disposed in a series arm. Parallel arm resonators P11, P12, P13, and P14 are disposed on respective parallel arms connecting the series arm and the ground potential. Each of the series arm resonators S11, S12, S13, and S14 also has a structure obtained by division of an acoustic wave resonator into multiple series arm resonators connected in series.

The second transmit filter 13 is connected between a transmit terminal 13a and the common terminal 2. The second transmit filter 13 includes series arm resonators S21 to S23 disposed in a series arm connecting the transmit terminal 13a and the common terminal 2, and the series arm resonators S21 to S23 are located in this order from the transmit terminal 13a side. A capacitor C is connected between the common terminal 2 and the series arm resonator S23. As shown, parallel arm resonators P21, P22a, P22b, and P23 are connected in respective parallel arms connecting the series arm and the ground potential as depicted.

The second receive filter 14 is connected between the common terminal 2 and a receive terminal 14a and has a circuit configuration the same as or similar to the circuit configuration of the first transmit filter 11. Series arm resonators S31 to S35 are disposed in this order from the common terminal 2 side. Parallel arm resonators P31, P32, P33, and P34 are disposed in respective parallel arms in this order from the common terminal 2 side.

The first transmit filter 11, the second transmit filter 13, the first receive filter 12, and the second receive filter 14 in the multiplexer 1 described above have a relationship Tx1c<Rx1c<Tx2c<Rx2c. The resonator closest to the common terminal 2 in the first receive filter 12 is the series arm resonator S11. The pitch ratio denoted by pS1 (Rx1)/p (Tx2) is, for example, more than about 1 and less than or equal to about 1.035, where p (Tx2) denotes the electrode finger pitch of the IDT electrode of the parallel arm resonator P23, which is the resonator closest to the common terminal 2 in the second transmit filter 13, and pS1 (Rx1) denotes the electrode finger pitch of the IDT electrode of the series arm resonator S11, which is closest to the common terminal 2 in the first receive filter 12. In this way, occurrence of IMD can be reduced or prevented, and degradation of receiving sensitivity of the second receive filter 14 can be prevented or reduced. This feature will be described with reference to FIG. 5 to FIG. 11.

Figure 5:
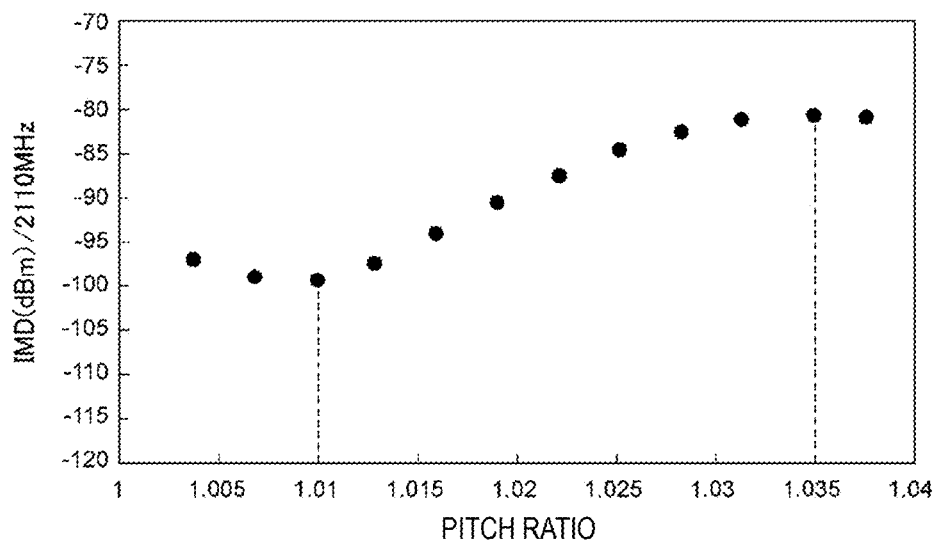
FIG. 5 shows a relationship between the pitch ratio and the magnitude of IMD at about 2110 MHZ.
Figure 6:
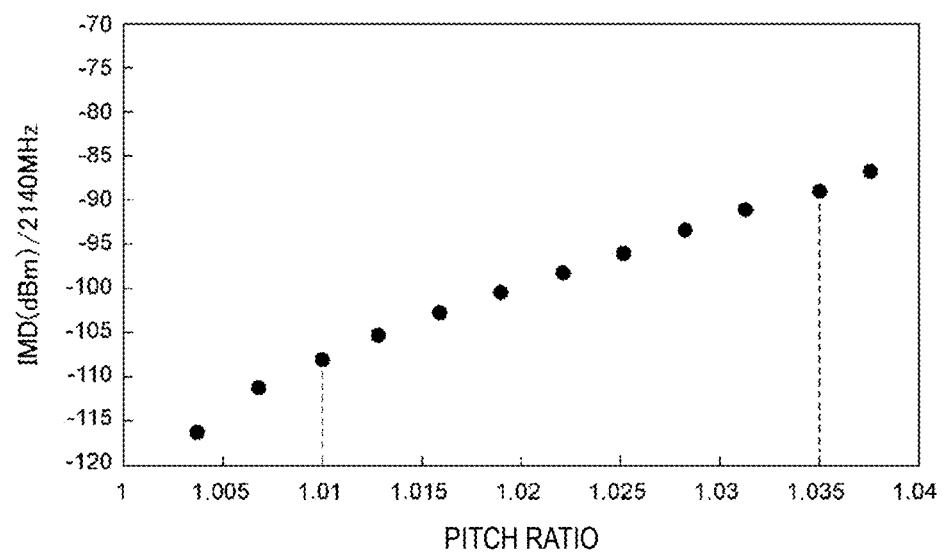
FIG. 6 shows a relationship between the pitch ratio and the magnitude of IMD at about 2140 MHz.
Figure 7:
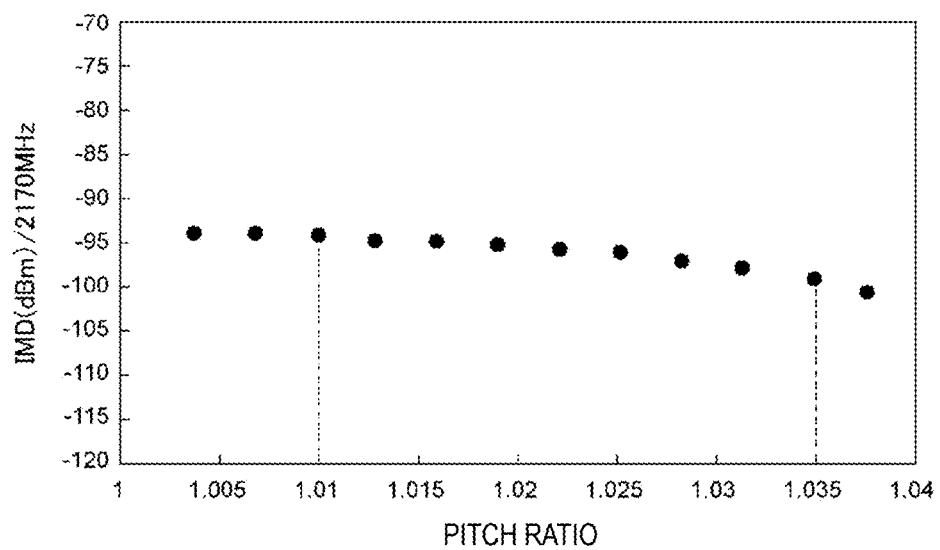
FIG. 7 shows a relationship between the pitch ratio and the magnitude of IMD at about 2170 MHz.

The inventor of preferred embodiments of the present invention investigated degradation of receiving sensitivity of the second receive filter 14 in the multiplexer described above. Consequently, the inventor of preferred embodiments of the present invention has discovered that simultaneous signal transmission from the first transmit filter 11 and the second transmit filter 13 generates IMD and the generated IMD is likely to degrade receiving sensitivity of the second receive filter 14. Further, the inventor of preferred embodiments of the present invention has discovered that the magnitude of such IMD can be reduced by adjusting the pitch ratio of the electrode finger pitch. FIGS. 5, 6, and 7 show the magnitude of IMD that appears on the common terminal 2 side at about 2110 MHZ, about 2140 MHz, and about 2170 MHz, respectively.

To evaluate IMD, the inventor of preferred embodiments of the present invention changed the pitch ratio, which is defined as the ratio of the electrode finger pitch of the IDT electrode of the series arm resonator S11 to the electrode finger pitch of the IDT electrode of the parallel arm resonator P23, the series arm resonator S11 being closest to the common terminal 2 in the first receive filter 12, the parallel arm resonator P23 being closest to the common terminal 2 in the second transmit filter 13. IMD was evaluated by inputting electric power of about +26 dBm into the pass band of the second transmit filter 13 and inputting a transmit signal in Band 3 from the common terminal 2, that is, inputting a transmit signal in the pass band of the first transmit filter 11 having electric power of about +10 dBm. Electric power is input at a transmit frequency in Band 1 and at a transmit frequency in Band 3, and IMD generated in Band 1, which is the pass band of the second receive filter, is evaluated. The relationship between these frequencies is provided by IMD=2×(the center frequency of the pass band in Band 1)−(the center frequency of the transmit band in Band 3)=(the receive frequency in the receive band in Band 1).

As shown in FIG. 5, it can be seen that IMD decreases as the pitch ratio decreases from about 1.035 to about 1.01 at about 2110 MHz. Thus, the pitch ratio needs to be equal to about 1.035 or less to improve IMD characteristics. In addition, as shown in FIG. 6, it can be seen that IMD at about 2140 MHz also decreases as the pitch ratio decreases. However, as shown in FIG. 7, IMD at about 2170 MHz increases to some extent in this case.

IMD characteristics can be improved as the pitch ratio decreases to about 1.035 or less as described above presumably because of the following reason. The magnitude of IMD in a multiplexer including transmit filters and receive filters in Band 1 and Band 3 described above is likely to be determined predominantly by characteristics of the second transmit filter and the first receive filter. However, if IMD levels due to the two filters are the same or similar and the phase difference is about 180±90 degrees, IMD due to the two filters can cancel each other out. In the present preferred embodiment, IMD due to the two filters presumably cancel each other out on the common terminal side at about 2110 MHZ, which is on a lower frequency side, thus leading to a decrease in the magnitude of IMD.

Figure 8:
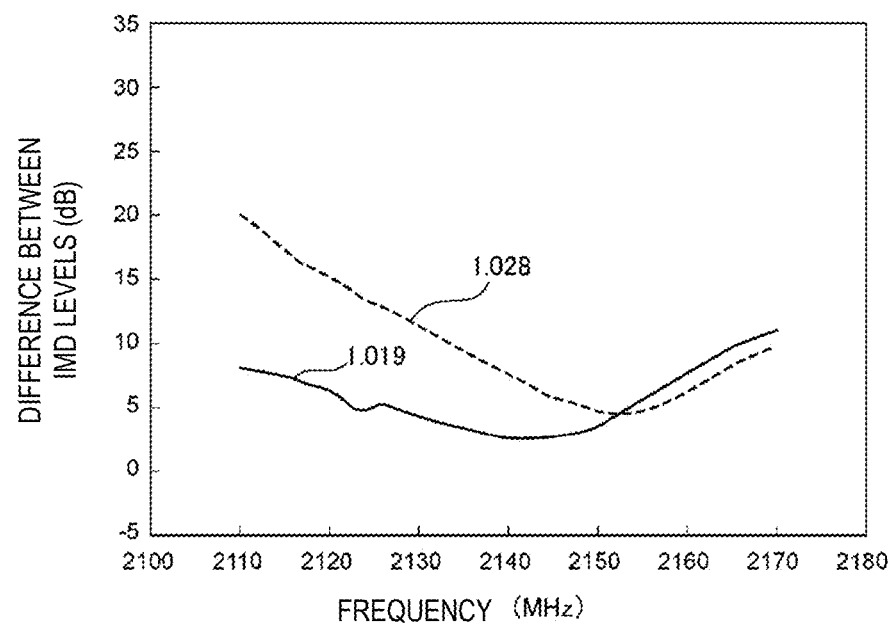
FIG. 8 shows frequency dependence of differences between IMD levels for multiplexers having the pitch ratios of electrode finger pitch of about 1.019 and about 1.028.
Figure 9:
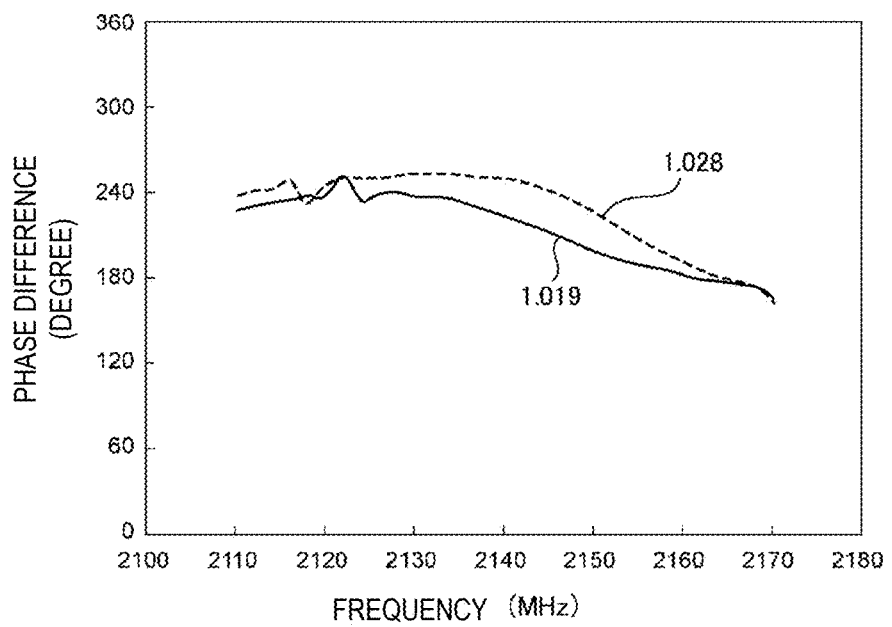
FIG. 9 shows frequency dependence of phase differences for multiplexers having the pitch ratios of electrode finger pitch of about 1.019 and about 1.028.

FIG. 8 shows frequency dependence of differences between the IMD level on the common terminal 2 side of the second transmit filter 13 and the IMD level on the common terminal 2 side of the first receive filter 12 at the pitch ratios of about 1.028 and about 1.019. FIG. 9 shows frequency dependence of differences between the IMD phases. At the pitch ratio of about 1.028, the difference between IMD levels is as large as about 20 dB at maximum, and the phase difference is equal to about 240 degrees or more on the lower frequency side. In other words, the cancellation effect described above is small.

However, at the pitch ratio as small as about 1.019, the difference between IMD levels is about 10 dB or less, and the phase difference is as small as about 240 degrees or less on the lower frequency side. In other words, it can be seen that the cancellation effect is large.

As can clearly be seen in FIG. 7, if the pitch ratio is equal to about 1.01 or more, IMD at about 2170 MHz is not very large.

Although the second receive filter 14 is provided in the present preferred embodiment, it is sufficient in the present invention that the first transmit filter 11, the second transmit filter 13, and the first receive filter 12 have a relationship Tx1c<Rx1c<Tx2c as described above and the pitch ratio described above is more than about 1 and less than or equal to about 1.035. Accordingly, if the issue is IMD at the first receive filter 12 and not IMD at the second receive filter 14, the second receive filter 14, which has a pass band higher than the pass band of the second transmit filter 13, need not be provided. The resonator closest to the common terminal 2 in the second transmit filter 13 may be a parallel arm resonator or a series arm resonator.

Figure 10A:
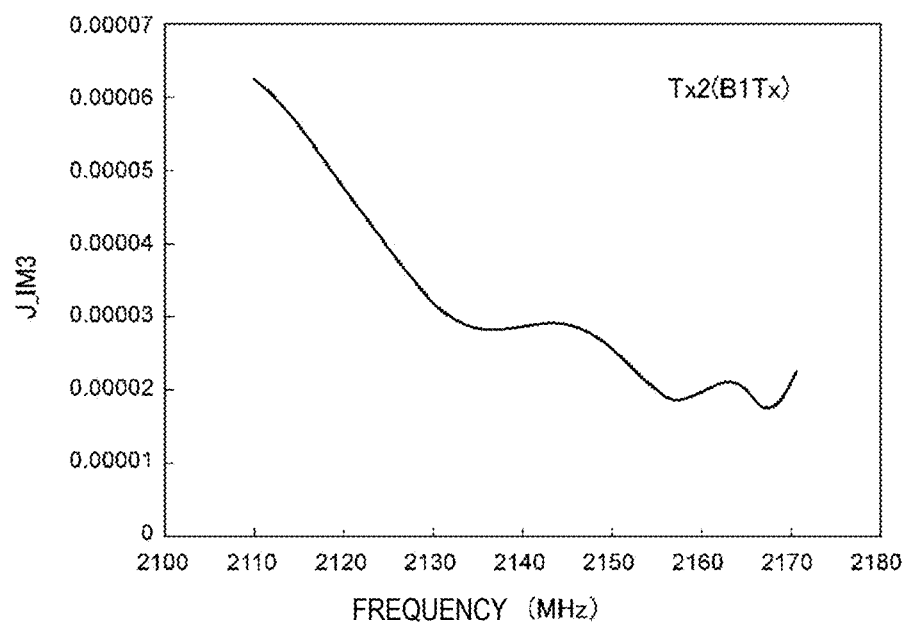
FIGS. 10A and 10B show frequency dependence of current density of resonators on the antenna side in the first transmit filter and the second transmit filter, respectively.
Figure 10B:
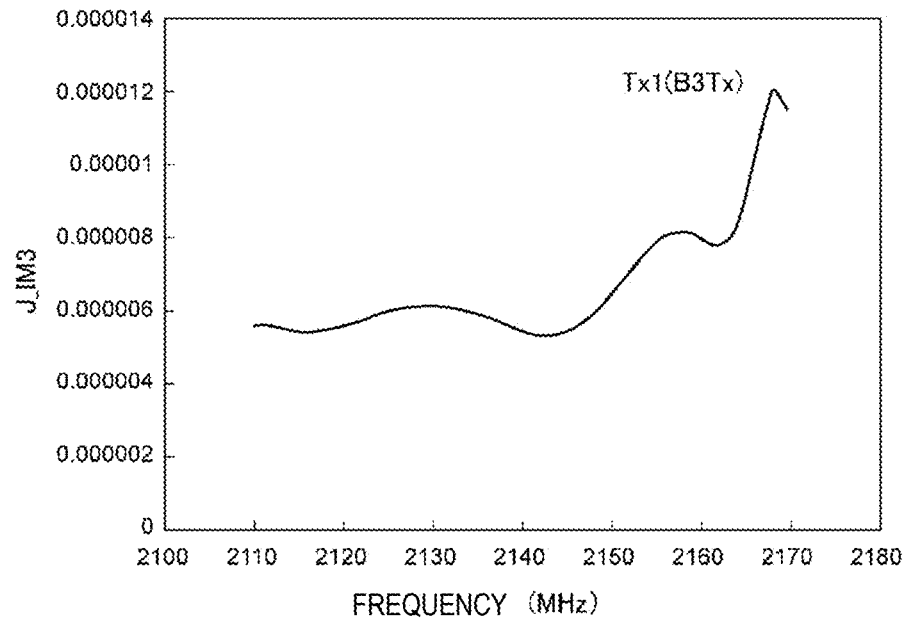
Figure 11A:
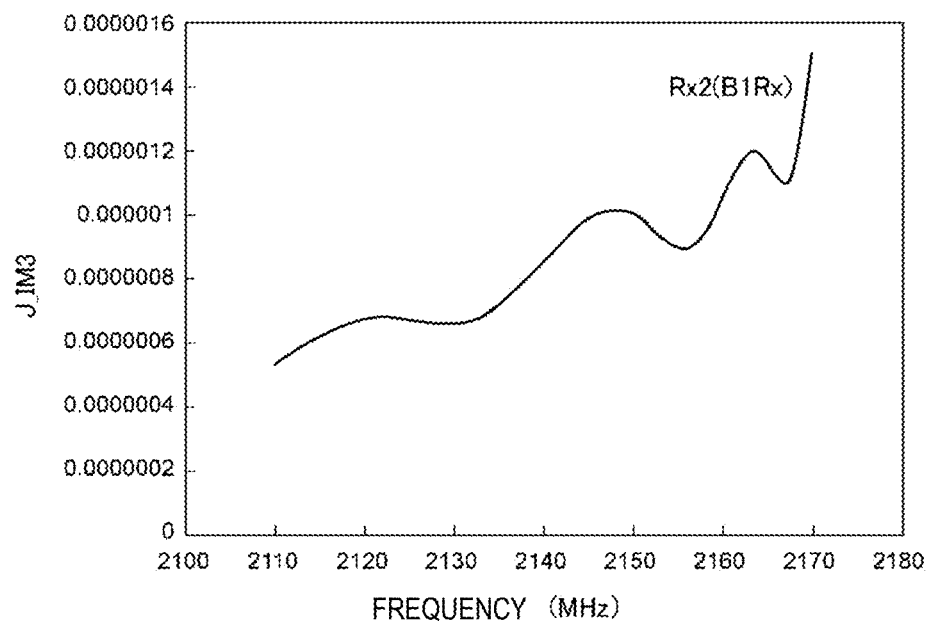
FIGS. 11A and 11B show frequency dependence of current density of resonators on the antenna side in the first receive filter and the second receive filter, respectively.
Figure 11B:
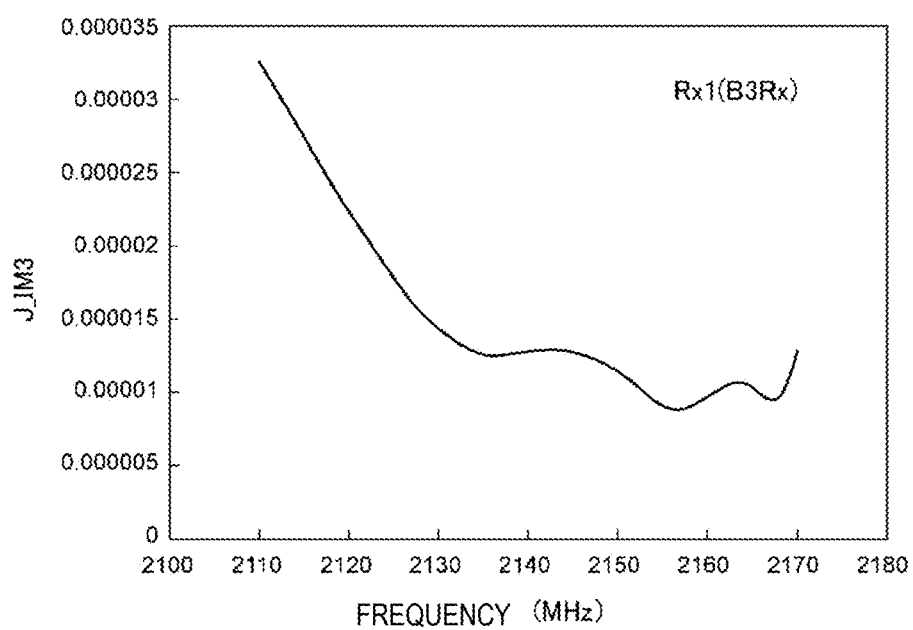

FIGS. 10A and 10B show frequency dependence of current density of resonators on the antenna side in the first transmit filter and the second transmit filter, respectively. FIGS. 11A and 11B show frequency dependence of current density of resonators on the antenna side in the first receive filter and the second receive filter, respectively. Each of the above figures shows a waveform of an IMD signal. As shown in FIG. 10A and FIG. 11B, waveforms of IMD signals in the second transmit filter 13 and the first receive filter 12 resemble each other in some cases. In such cases, the IMD signals can cancel each other out by adjusting the phase difference between the IMD signals at the second transmit filter 13 and the first receive filter 12 to about 180 degrees. The multiplexer 1 may include a phase-shift circuit. The phase-shift circuit enables adjustment of the phase difference between IMD signals. The phase-shift circuit may preferably be connected between the second transmit filter 13 and the common terminal 2. The second transmit filter 13 is a transmit filter in, for example, Band 1. Thus, high electric power is input into the second transmit filter 13. Accordingly, the phase of the IMD signal is easily adjusted, providing a more reliable method of causing signals to cancel each other out. As shown in FIG. 10B and FIG. 11A, the relationship between the first transmit filter 11 and the second receive filter 14 is the same as or similar to the relationship between the second transmit filter 13 and the first receive filter 12. The phase-shift circuit may be connected between the common terminal 2 and at least one of the first transmit filter 11, the first receive filter 12, the second transmit filter 13, and the second receive filter 14. Examples of the phase-shift circuit include a capacitor, an inductor, a circuit including a combination thereof, or a transmission line.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A multiplexer comprising:
a common terminal; and
a first transmit filter, a second transmit filter, and a first receive filter connected to the common terminal and each including a plurality of resonators; wherein
a relationship Tx1c<Rx1c<Tx2c is satisfied, where Tx1c, Tx2c, and Rx1c denote center frequencies of a pass band Tx1 of the first transmit filter, a pass band Tx2 of the second transmit filter, and a pass band Rx1 of the first receive filter, respectively;

a resonator of the plurality of resonators closest to the common terminal in the first receive filter is a series arm resonator; and a pitch ratio denoted by pS1 (Rx1)/p (Tx2) is more than about 1 and less than or equal to about 1.035, where p (Tx2) denotes an electrode finger pitch of an interdigital transducer (IDT) electrode in a resonator of the plurality of resonators closest to the common terminal in the second transmit filter and pS1 (Rx1) denotes an electrode finger pitch of an IDT electrode of the series arm resonator closest to the common terminal in the first receive filter.

2. The multiplexer according to claim 1, wherein the pitch ratio denoted by pS1 (Rx1)/p (Tx2) is more than or equal to about 1.01.

3. The multiplexer according to claim 2, wherein the resonator closest to the common terminal in the second transmit filter is a parallel arm resonator.

4. The multiplexer according to claim 2, wherein the resonator closest to the common terminal in the second transmit filter is a series arm resonator.

5. The multiplexer according to claim 2, further comprising a second receive filter having a pass band higher than the pass band of the second transmit filter.

6. The multiplexer according to claim 2, further comprising a phase-shift circuit connected between the second transmit filter and the common terminal.

7. The multiplexer according to claim 1, wherein the resonator closest to the common terminal in the second transmit filter is a parallel arm resonator.

8. The multiplexer according to claim 7, further comprising a second receive filter having a pass band higher than the pass band of the second transmit filter.

9. The multiplexer according to claim 7, further comprising a phase-shift circuit connected between the second transmit filter and the common terminal.

10. The multiplexer according to claim 1, wherein the resonator closest to the common terminal in the second transmit filter is a series arm resonator.

11. The multiplexer according to claim 10, further comprising a second receive filter having a pass band higher than the pass band of the second transmit filter.

12. The multiplexer according to claim 10, further comprising a phase-shift circuit connected between the second transmit filter and the common terminal.

13. The multiplexer according to claim 1, further comprising a second receive filter having a pass band higher than the pass band of the second transmit filter.

14. The multiplexer according to claim 13, further comprising a phase-shift circuit connected between the second transmit filter and the common terminal.

15. The multiplexer according to claim 1, further comprising a phase-shift circuit connected between the second transmit filter and the common terminal.

* * * * *